United States Patent [19]

Haarde

[11] Patent Number: 4,835,345
[45] Date of Patent: May 30, 1989

[54] PRINTED WIRING BOARD HAVING ROBBER PADS FOR EXCESS SOLDER

[75] Inventor: John F. Haarde, The Woodlands, Tex.

[73] Assignee: Compaq Computer Corporation, Houston, Tex.

[21] Appl. No.: 245,951

[22] Filed: Sep. 15, 1988

Related U.S. Application Data

[63] Continuation of Ser. No. 98,415, Sep. 18, 1987, abandoned.

[51] Int. Cl.⁴ .......................... H05K 1/00; H05K 3/34
[52] U.S. Cl. .................................... 174/68.5; 29/843; 361/403
[58] Field of Search ................ 174/68.5; 29/829, 843; 361/397, 403; 228/180.1

[56] References Cited

U.S. PATENT DOCUMENTS

| | | | |
|---|---|---|---|
| 3,567,844 | 3/1971 | Kremar | 174/68.5 |
| 3,610,811 | 10/1971 | O'Keefe | 174/68.5 |
| 3,644,792 | 2/1972 | Fields | 361/403 |
| 3,833,838 | 9/1974 | Christiansen | 174/68.5 X |
| 3,865,298 | 2/1975 | Allen et al. | 228/20 |
| 3,883,682 | 3/1975 | Cagle et al. | 174/68.5 |
| 3,923,359 | 12/1975 | Newsam | 174/68.5 X |
| 4,343,084 | 8/1982 | Wilmarth | 29/843 |
| 4,464,704 | 8/1984 | Huie et al. | 174/68.5 X |
| 4,638,116 | 1/1987 | Gumb | 174/68.5 |

FOREIGN PATENT DOCUMENTS

| | | |
|---|---|---|
| 2008302 | 2/1970 | Fed. Rep. of Germany . |
| 2837318 | 8/1978 | Fed. Rep. of Germany . |

OTHER PUBLICATIONS

Donald A. Elliott, "Hot Air Leveling of Printed Wiring Boards", Presented at Nepcon-East, Philadelphia, May 17–19, 1977.
Western Electric Technical Digest No. 20, "Programmable Through-Hole Connection", J. M. Glasson and F. K. Heffley, Oct. 1970.

Primary Examiner—Morris H. Nimmo
Attorney, Agent, or Firm—Christopher D. Keirs

[57] ABSTRACT

A printed wiring board is disclosed which has one or more solder pads of special configuration which receive and contain excess solder which might otherwise bridge adjacent downstream leads of a component having closely spaced leads when the component is mounted to the printed circuit board in a wave-soldering process. The special solder pad configuration may be viewed as an extra solder pad (a "robber pad") at the downstream end of a linear array of solder pads which is connected to the adjacent upstream solder pad by a solder-wettable bridge.

21 Claims, 2 Drawing Sheets

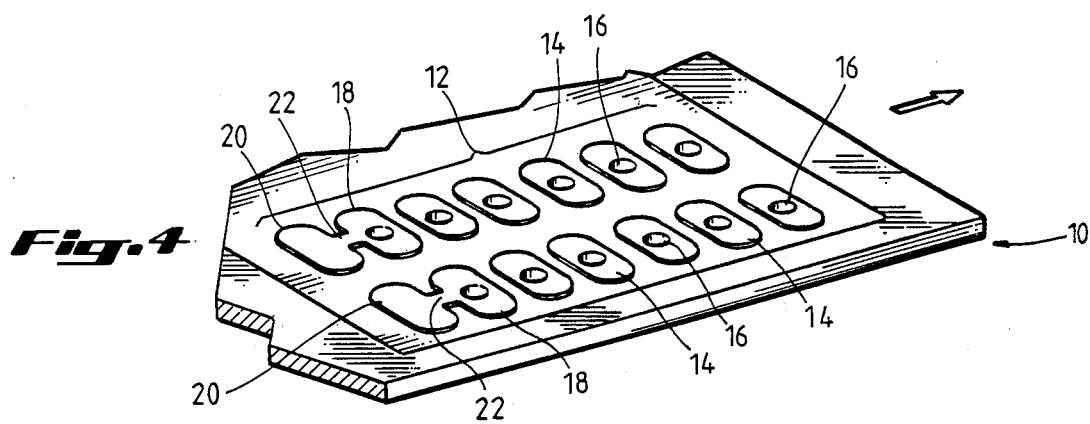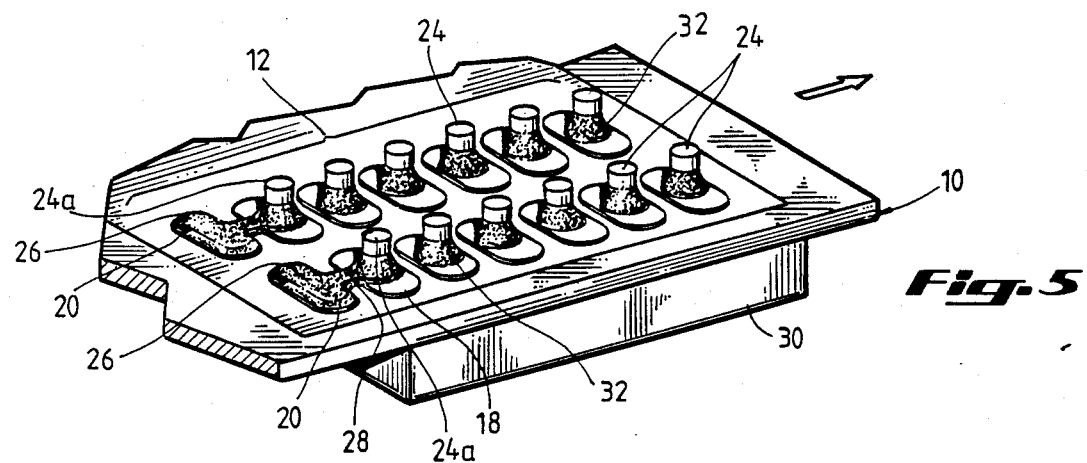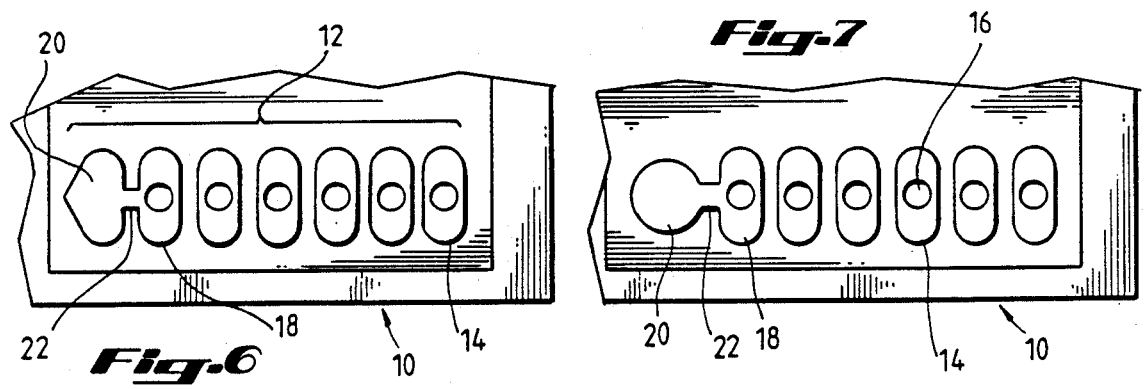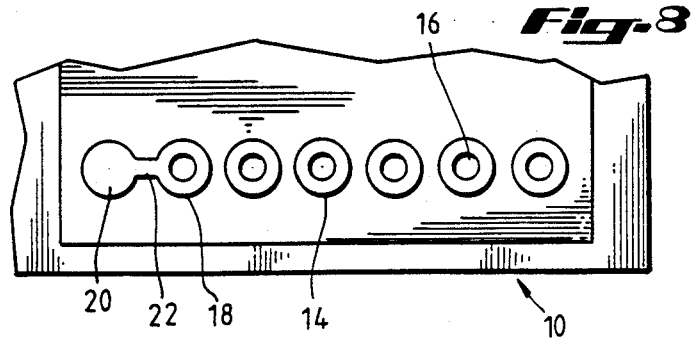

PRINTED WIRING BOARD HAVING ROBBER PADS FOR EXCESS SOLDER

This is a continuation of co-pending application Ser. No. 098,415 filed on Sept. 18th, 1987, abandoned.

BACKGROUND OF THE INVENTION

1. Field of the Invention

This invention relates to printed wiring boards. More particularly it relates to printed wiring boards designed for wave soldering operations. Printed wiring boards are also known as printed circuit boards.

2. The Problem Solved by the Invention

Printed circuit boards (PCB's) are most laminates of glass-filled epoxy insulating layers and layers of etched copper conductors. The simplest interconnection structure consists of a single layer of insulation made of a glass-filled epoxy and a single layer of copper conductors. More complex structures consist of numerous layers of conductors and insulators which are divided into power distribution layers, signal layers, and ground plane layers. As used in this disclosure, the terms printed circuit board and printed wiring board (PWB) are synonymous.

In integrated structures such as those associated with semiconductor circuits, the first level of packaging consists of a number of switching circuits fabricated on a single part called a chip. The chip is mounted in a structure called a module, which provides environmental protection for the chip and permits electrical interconnection to be made to the next level of package. Modules are normally provided in standard configurations to allow for the design of general-purpose manufacturing equipment and higher-level packages. A particularly common standard configuration is the dual in-line pin ("dip" or "d-i-p") package. Such a module is substantially rectangular as viewed from above and has two rows of electrical leads projecting from opposite edges of the module. The lead spacing is typically 0.100" on center. Most commonly the leads will have a 90° bend in them such that the leads project downward from the plane of the chip.

Circuit modules are most often mounted to PCB's by inserting the component leads into holes in the circuit board which extend from one side of the PCB (the "component side") to the other side of the board ("solder side" or "conductor side"). Surrounding each hole on the solder side of the circuit board is a solder pad. The leads are mechanically and electrically connected to the circuit board by soldering each lead projecting through its designated hole in the circuit board to the solder pad which surrounds the hole. Such soldering may be accomplished either manually or by machine soldering processes. Probably the most common type of machine soldering process is wave soldering.

FIG. 1 depicts a typical wave soldering process for printed circuit boards. Molten solder is pumped up and over support plates to form a wave. A printed circuit board carried on a conveyor is passed over the solder wave at an angle such that the solder side (conductor side) of the board contacts the leading edge of the solder wave. Component leads are soldered to the solder pads on the wiring board and plated through-holes fill with solder by capillary action.

If two clean metal surfaces are held together and dipped into molten solder, the solder will wet the metal and climb up to fill the gaps between the adjacent surfaces. This phenomenon is the result of capillary action. Wave soldering processes rely on this phenomenon to fill plated through-holes and produce a fillet of solder both on the upper surface (component side) of the circuit board and surrounding the portion of the lead which projects through the plated through-hole to the solder side of the circuit board. This results in a greater area of electrical contact between the component leads and the conductors of the printed wiring board thereby decreasing the electrical resistance and increasing the mechanical integrity of such connections.

This same phenomenon, however, can produce unwanted solder bridging between closely spaced component leads. The trend towards higher density circuit boards (i.e., the closer spacing of components on printed wiring boards) has made this a matter of particular concern to electronic manufacturers. Generally, the problem is non-existent or minimal for components having a lead spacing of 0.100" or more. However, when lead spacing is reduced below about 0.070", the problem becomes noticeable. At a lead spacing of 0.050", the problem is significant.

Many circuit board components, particularly connectors for ribbon cable and the like, now have leads with 0.050-inch spacing. More and more components with such closely spaced leads are likely to be used in the future as the trend to higher and higher circuit board density continues.

The problem is illustrated in FIGS. 2 and 3. An electronic or electrical component (such as a ribbon cable terminal) is mounted on a printed wiring board with its leads projecting through the board. Each lead hole in the board is surrounded by a solder pad on the solder side of the circuit board. The circuit board is then passed through a wave soldering machine as illustrated in FIG. 1. The direction of the board's passage through the solder wave is indicated by the arrows in FIGS. 2 and 3.

As the board passes through the solder wave a solder fillet forms around each lead connecting the lead to the surrounding solder pad. For closely spaced leads, a bridge of molten solder also forms between adjacent leads. It is believed that this solder bridge wicks from one pair of adjacent leads to the next (downstream) pair as successive leads pass through the solder wave. Thus, this solder bridge is a transient phenomenon for most of the leads. However, when the last (downstream) lead of the component passes through the solder wave, there is no adjacent downstream lead to wick the solder bridge further downstream. It therefore remains established between the last two leads in the array as shown in FIG. 3 and solidifies as the board exits the solder wave.

In the past it has been necessary to manually remove such solder bridges by reheating the connections and removing the excess solder with a vacuum device such as a solder sucker or with a copper braid or the like (which wicks molten solder). This is a time-consuming process and it has the further disadvantage of weakening the solder connections to the printed circuit board since each remelting of a soldered joint degrades such a connection.

In the alternative, solder bridging may be mechanically removed by scraping, cutting, or the like. Again, this is a time-consuming process which has a significant probability of damaging the electrical and/or mechanical integrity of the connection.

The present invention solves this problem.

SUMMARY OF THE INVENTION

The present invention comprises a printed wiring board having one or more solder pads of special configuration which receive and contain excess solder which would otherwise bridge adjacent downstream leads of an electrical component having closely spaced leads. The "downstream leads" are those leads of a component which contact the solder wave in a wave soldering machine subsequent to the "upstream leads"—i.e., the most upstream lead of a component is that lead of a component which is nearest the edge of the printed wiring board which first contacts the solder wave and the most downstream lead is the lead at the opposite end of the array of leads.

This special solder pad configuration may be viewed as an extra solder pad (a "robber pad" or "dummy pad") at the downstream end of an array of solder pads which is connected to the adjacent upstream solder pad by a solder-wettable bridge or it may be viewed as a different shape for the last (most downstream) solder pad in an array of solder pads. In certain embodiments this shape approximates the letter "H"; in other embodiments it resembles a dumbbell. In any case, it is an extra pad or pad area which does not surround an operative or active electrical lead, but instead serves to draw solder from one side of a given solder pad which would otherwise tend to be drawn to a second solder pad on the opposite side of the given solder pad.

BRIEF DESCRIPTION OF THE DRAWINGS

FIG. 4 is a perspective view of a portion of a printed wiring board embodying the present invention.

FIG. 5 is a perspective view of the circuit board shown in FIG. 4 with the addition of a component mounted to the board by a wave soldering process.

FIGS. 6-8 illustrate various embodiments of the invention. The views shown are solder-side plan views of the circuit board.

DETAILED DESCRIPTION

Figure 1:
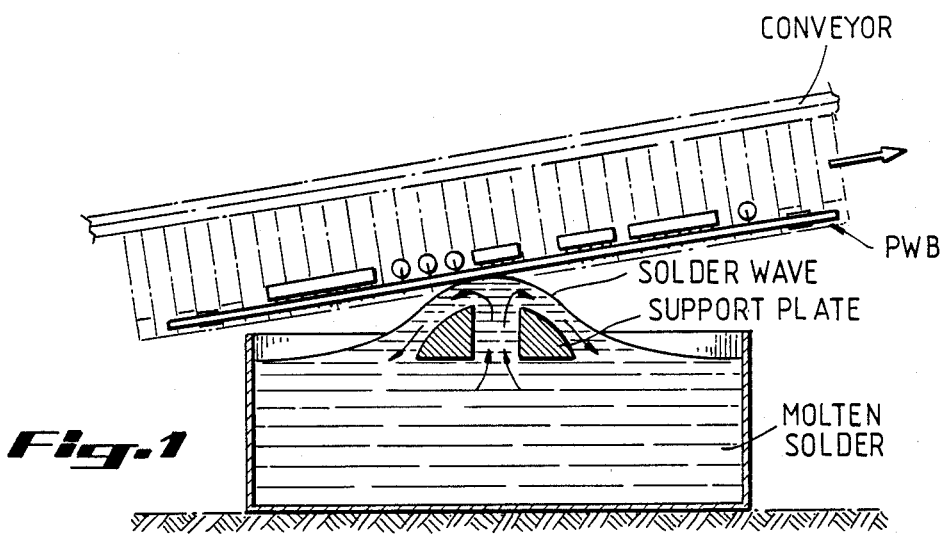
FIG. 1 depicts a printed circuit board undergoing wave soldering.
Figure 2:
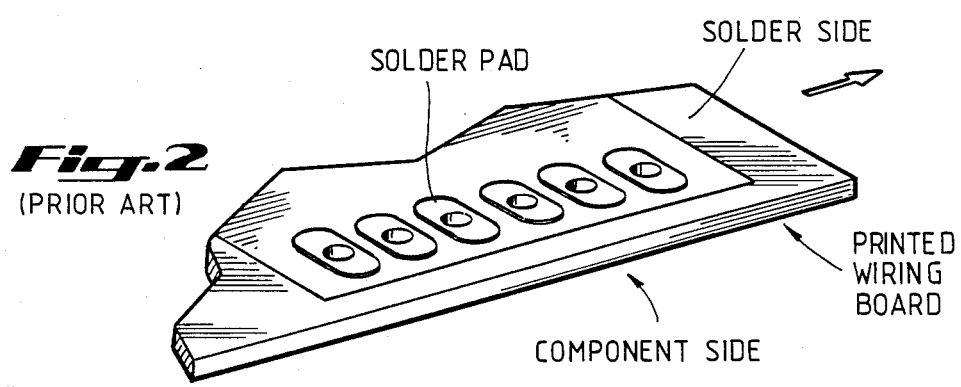
FIG. 2 is a perspective view of a portion of a printed wiring board showing a typical configuration of solder pads of the prior art.
Figure 3:
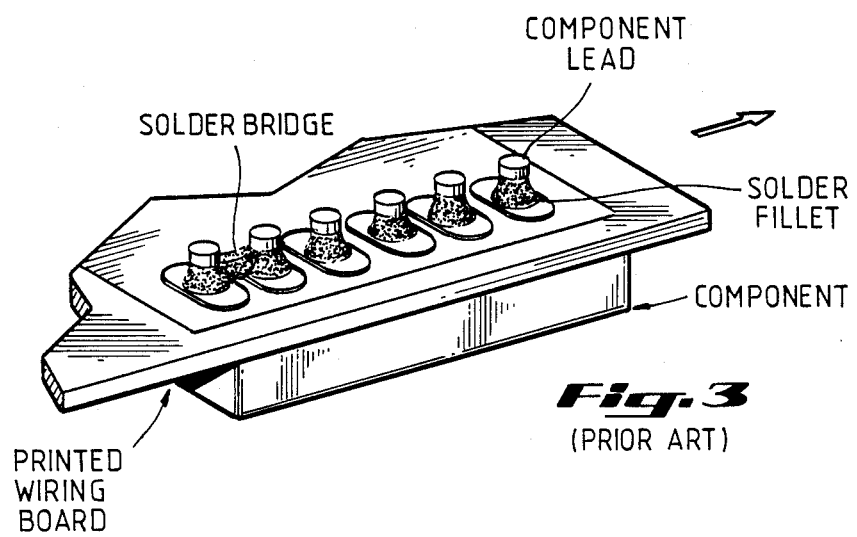
FIG. 3 is a perspective view of a printed wiring board of the prior art (as shown in FIG. 2) with a mounted component. This figure illustrates the problem solved by the present invention—the solder bridge between the last two (downstream) leads of the component.

It has been discovered that if an extra solder pad is provided at the downstream end of a substantially linear array of solder pads and that extra pad (or "robber pad") is connected to the adjacent upstream solder pad by a solder-wettable bridge it will attract and contain excess solder which might otherwise bride the leads of a component mounted to the linear array of solder pads in a wave soldering process.

Viewed another way, it has been found that if the most downstream solder pad in a linear array of solder pads is provided with a special configuration, solder bridging between the two most downstream leads of a component mounted to the linear array of solder pads using a wave soldering process may be avoided.

Referring now to FIG. 4, linear array 12 of solder pads 14 may be seen on the solder side (conductor side) of printed wiring board 10. Holes 16 are provided through the lead-receiving solder pads to receive the electrical leads of a component designed for mounting on such a circuit board. The intended direction of passage of the PCB through a wave soldering machine is indicated by the arrow in the drawing.

If the solder pad in the depicted array nearest the leading edge of the PCB is considered the first solder pad, it will be noted that the last solder pad (20 in the figure) is not provided with a lead-receiving hole and is connected to the adjacent solder pad (18 in the figure) by solder-wettable bridge 22.

Viewed another way, the last solder pad in the array comprises lead-receiving portion 18, excess solder receiving portion 20, and bridge portion 22. Optionally, excess solder receiving portion 20 may be provided with a plated through-hole to accommodate an even greater volume of excess solder.

FIG. 5 depicts the printed wiring board of FIG. 4 following insertion of component 30 and subsequent to wave soldering. Component 30 has a substantially linear array of leads 24 which project through lead receiving holes 16 in the circuit board. If the PCB is passed through the wave soldering machine in the direction shown by the arrow in the figure, lead 24a will be the last lead in that particular array to contact the molten solder. Thus, lead 24a may be referred to as "the downstream lead." It should be understood that component 30 may often be of the d-i-p configuration, i.e., have two parallel rows of leads. The drawing figures show only one such row, but the other row (or any other rows associated with components having a plurality of substantially linear lead arrays) would be substantially identical to that shown.

During the soldering process a fillet of solder 32 forms around each lead bonding it to the surrounding solder pad. As shown in FIG. 5, excess solder 26 flows onto robber pad 20 where it solidifies. A portion 28 of the excess solder remains on solder-wettable bridge 22. The potential for the formation of a solder bridge between the last lead in the array (24a in the figure) and the upstream adjacent lead is greatly reduced by providing a solder-wettable area downstream from lead 24a.

The actual shape or configuration of the robber pad (or robber pad/downstream pad pair) may vary substantially. Some alternative configurations are shown in FIGS. 6-8. It will often be most convenient to have the robber pad be of the same configuration as the other solder pads in the array as in the embodiments shown in FIGS. 4 and 8. Stated another way, from a design perspective it is perhaps easier to have the excess solder receiving portion be substantially the same shape as the lead receiving portion (less the lead receiving hole). But the invention is not dependent upon such a similarity of shape or upon any particular configuration.

It may be noted that when the solder pads in the array are substantially elliptical in shape (or when both the lead receiving portion and the excess solder receiving portion are substantially elliptical), a solder pad embodying the present invention resembles the capital letter "H" as may be seen in FIG. 4. When the solder pads in the array are substantially circular in shape (or when both the lead receiving portion and the excess solder receiving portion are substantially circular), a solder pad embodying the present invention resembles a dumbbell as may be seen in FIG. 8. As illustrated in FIGS. 6 and 7, the robber pad may have a configuration different from that of the other solder pads in the linear array. Viewed another way, the outline of a solder pad embodying the present invention need not be symmetrical about a line drawn perpendicular through the major axis of the solder bridge.

The size and shape of bridge 22 may similarly be varied considerably without adverse effect. It has been found that for the configuration shown in FIG. 4 with a lead spacing of 0.050 inch, a solder-wettable bridge having a width of about 0.008 inch performs well. It is contemplated that the width of such a solder-wettable bridge could be varied between about 0.005 and about 0.020 inch. It is critical that the robber pad (or "dummy pad") be connected by a solder-wettable bridge to the most downstream pad in the linear array of solder pads. The exact configuration and dimensions of the bridge, however, are not critical and may be varied to the extent that the bridge (or bridge portion of the solder pad) functions to conduct molten solder to the robber pad (or excess-solder-receiving portion of the solder pad).

Like any solder pad, it is important that both the robber pad and the bridge portion (20 and 22, respectively in the figures) be solder-wettable. A clean metal surface is preferred. Most preferred is a fluxed, tinned, copper surface. This is the usual surface of a printed wiring board immediately prior to its being subjected to wave soldering inasmuch as most machine soldering processes include a fluxing step prior to contacting the PCB with molten solder.

The foregoing description has been directed to particular embodiments of the invention in accordance with the requirements of the United States patent statutes for the purposes of illustration and explanation. It will be apparent to those skilled in this area, however, that many modifications and changes in the configurations and methods set forth will be possible without departing from the scope and spirit of the invention. It is intended that the following claims be interpreted to embrace all such modifications and changes.

What is claimed is:

1. A printed circuit board comprising an array of solder pads which array comprises a row of substantially equally spaced, insular solder pads with the solder pad at one end of the row being substantially H-shaped with the bar of the H in line with the row.

2. A printed circuit board comprising an array of solder pads which array comprises a row of substantially equally spaced, insular solder pads with the solder pad at one end of the row being substantially dumbbell-shaped with the ends of the dumbbell in line with the row.

3. A printed circuit board comprising an array of solder pads which array comprises two parallel rows of substantially equally spaced, insular solder pads and a separate solder-wettable bridge connecting the corresponding last solder pad in each row with a dummy pad in line with the row.

4. A printed circuit board as recited in claim 3 wherein the dummy pad in each row is solid.

5. A printed circuit board as recited in claim 3 wherein the dummy pad in each row has no lead-receiving hole therein.

6. A printed circuit board as recited in claim 7 wherein all but the dummy pad in each row has a lead-accepting hole extending through the circuit board.

7. A printed circuit board as recited in claim 3 wherein the only electrical connection to the dummy pad in each row of the array of solder pads is through the solder-wettable bridge.

8. A printed circuit board as recited in claim 3 further comprising a plated through-hole in the dummy pad in each row of the array of solder pads.

9. A printed circuit board comprising an array of solder pads which comprises parallel rows of substantially equally spaced pads with corresponding first and second row ends, a separate first solder pad at the first end and a last solder pad at the second end of each row and a separate solder-wettable bridge connecting the last and the next-to-the-last solder pads in each row.

10. A printed circuit board as recited in claim 9 wherein all but the last solder pad in each row has a lead-accepting hole therein.

11. A process for machine soldering a printed circuit board having a component side and a solder side which comprises:
(a) providing an array of solder pads on the solder side of a circuit board which array comprises two rows of substantially equally spaced solder pads, each row having a first solder pad at one end and a last solder pad at the opposite end and with the last and the next-to-the-last solder pads in each row connected by a solder-wettable bridge;
(b) inserting the leads of an electrical component from the component side of the circuit board through all but the last solder pad in each row of the array of solder pads on the solder side of the circuit board;
(c) passing the circuit board across a wave of molten solder such that the solder contacts the solder side of the printed circuit board, the passing being in a direction substantially parallel to the rows of solder pads in the array of solder pads and from said one end toward said opposite end in relation to the wave.

12. A process as recited in claim 11 wherein the passing is accomplished such that the first solder pad in each row of the array of solder pads contacts the wave of molten solder prior to the last solder pad in each row.

13. A printed circuit board designed to receive an electrical component having 2n leads arranged in two substantially parallel rows of n leads each which comprises:
an array of 2n+2 solder pads arranged in two substantially parallel rows of n+1 solder pads, each row having a single solder-wettable bridge connecting the nth solder pad in each row to the adjacent solder pad which is at one end of the row of solder pads.

14. A printed circuit board comprising a substantially linear array of solder pads, the linear array having a first end and a second end, which comprises:
an insular solder pad at the first end of the array; and,
an end solder pad at the second end of the array which comprises
a lead-receiving portion;
an excess solder-receiving portion positioned on a side of the end solder pad opposite the solder pad next adjacent to the end solder pad; and,
a solder-wettable bridge connecting the lead-receiving portion and the excess solder-receiving portion.

15. A printed circuit board as recited in claim 14 wherein the solder pads in the array other than the end solder pad at the second end of the array are substantially the same as the lead-receiving portion of the solder pad at the second end of the array.

16. A printed circuit board, comprising:

(a) a component side;

(b) a conductor side including a linear array of insular solder pads, each such solder pad surrounding a hole extending through the circuit board to the component side, the last such solder pad at one end of the array spaced from the penultimate solder pad at the same end of the array a distance small enough to enable molten solder to bridge between the last and penultimate pads; and, (c) a solder-wettable bridge joining a robber pad to the last solder pad to cause molten solder to bridge from the last solder pad to the robber pad in preference to the penultimate solder pad at the same end of the array, the robber pad forming an extension of said linear array.

17. A method of making the conductor side of a printed circuit board which comprises:

(a) providing the conductor side of a printed circuit board with a linear array of insular solder pads, each such solder pad contacting a hole for the passage of a lead wire, each such solder pad and its respective hole being spaced from each next adjacent solder pad and hole in the array;

(b) providing a robber solder pad at one end of the linear array to extend the linear array; and, (c) connecting the robber solder pad to the solder pad at said end of the linear array with a solder-wettable bridge.

18. In a method of wave-soldering an array of lead wires from the component side of a printed circuit board to a linear array of solder pads on the conductor side of the printed circuit board, wherein the wave-soldering progresses from an upstream end of the linear array to the downstream end of the linear array, the improvement which comprises:

(a) prior to the wave-soldering placing a robber solder pad at the downstream end of the linear array and in alignment with the linear array, and connecting the end solder pad at the downstream end to the robber pad with a solder-wettable bridge; and, (b) during the wave-soldering extending the wave-soldering to include the bridge and the robber pad.

19. A printed circuit board comprising:

(a) a linear array of insular solder pads, each such pad disposed around a lead-receiving hole in the board; and, (b) a dummy solder pad connected by a solder-wettable bridge to the solder pad at one end of the array and in alignment with the array.

20. A printed circuit board comprising:

a plurality of insular solder pads, each such insular pad surrounding a lead-receiving aperture in the board;

said insular solder pads arranged to be wave-soldered in sequence from a first solder pad at an upstream end to a second solder pad at a downstream end;

a dummy solder pad downstream from the second solder pad; and, a solder-wettable bridge connecting the dummy solder pad to the second solder pad.

21. A printed circuit board comprising:

a plurality of insular solder pads array on the board to be wave-soldered from an upstream end to a downstream end;

each said insular solder pad positioned around a lead-receiving hole in the board to be wave-soldered to a lead in its respective hole;

a solder robber pad on the board downstream from said solder pad at the downstream end of the array of solder pads; and, a solder-wettable bridge on the board connecting the robber pad to said end solder pad.

* * * * *